United States Patent
Harada

(10) Patent No.: US 7,523,030 B2
(45) Date of Patent: Apr. 21, 2009

(54) SIMULATION SYSTEM AND COMPUTER PROGRAM

(75) Inventor: Toshimine Harada, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 521 days.

(21) Appl. No.: 11/236,679

(22) Filed: Sep. 28, 2005

(65) Prior Publication Data

US 2006/0069538 A1   Mar. 30, 2006

(30) Foreign Application Priority Data

Sep. 30, 2004   (JP)   ............................. 2004-287973

(51) Int. Cl.
 *G06F 17/50* (2006.01)
 *G06F 11/30* (2006.01)
(52) U.S. Cl. ................................ 703/14; 703/22; 716/5
(58) Field of Classification Search .................. 703/17, 703/20, 14, 22; 716/4, 5
See application file for complete search history.

(56) References Cited

U.S. PATENT DOCUMENTS

| 6,285,976 B1 * | 9/2001 | Rotbart ........................ 703/17 |
| 6,782,354 B1 | 8/2004 | Ikegami |
| 2003/0018888 A1 * | 1/2003 | Ara et al. .................... 713/151 |
| 2004/0230928 A1 * | 11/2004 | Nozuyama ..................... 716/5 |

FOREIGN PATENT DOCUMENTS

| JP | 2001-109788 A | 4/2001 |
| JP | 2003-067438 A | 3/2003 |

* cited by examiner

*Primary Examiner*—Thai Phan
(74) *Attorney, Agent, or Firm*—Foley & Lardner LLP

(57) ABSTRACT

Disclosed is a simulation system for displaying source lines in a behavior level description during execution of simulation to indicate the execution status of a conditional branch statement in a state, including a simulation model generation unit, a simulator and a simulation monitor. The simulation model generation unit receives a source file including a behavior level description composed of a plurality of lines and that generates a simulation model, which includes a finite state machine (FSM), from the behavior level description. The simulation model generation unit generates a simulation model, in which identification information (branch ID) is assigned to a conditional branch statement in a state, and generates a behavior level description source line—branch ID correspondence table. The simulator receives the simulation model for executing simulation; and a simulation monitor monitors the execution of simulation, extracts the branch ID in a state when a state transition to said state occurs, obtains the number of a source line in the behavior level description corresponding to the extracted branch ID from the behavior level description source line—branch ID correspondence table, and displays the source line in the behavior level description having the obtained line number in a form distinguishable from other lines.

16 Claims, 18 Drawing Sheets

FIG . 4

```
1 : in ter(0:1) i1;
2 : in ter(0:1) i2;
3 : in ter(0:1) i3;
4 : out reg(0:1) o1;
5 :
6 : process main(){
7 :    var(0:1) A;
8 :    var(0:1) B;
9 :    var(0:1) C;
10:
11:    A=i2; B=i3;
12:    if ( i1 != 0 ) {
13:     C = A + 10;}
14:    else {
15:     C = B + 20;}
16:    o1 = A+B+C;
17: }
```

FIG. 7

```
1 :#define CM_CHANGE_APPEND(pos) {CysimChangeList[CysimChangeTableMax++]=pos;}
2: in ter(0:1) i1, i2, i3;
3 : out reg(0:1) o1;
4 :
5 : switch (STATE){
6 : case ST1:
7 :     Reg_A = i1; Reg_B = i3;
8:      CM_CHANGE_APPEND(0);
9 :     STATE = ST2;
10:     break;
11:
12: case ST2:
13:    if ( i1 != 0){
14:       CM_CHANGE_APPEND(1);
15:       Reg_C = Reg_A + 10;}
16:    else {
17:       CM_CHANGE_APPEND(2);
18:       Reg_C = Reg_B + 20;}
19:    STATE = ST3;
20:    break;
21:
22: case ST3:
23:    Reg_o1 = Reg_A + Reg_B + Reg_C;
24:    CM_CHANGE_APPEND(3);
25:    STATE = ST4;
26:    break;
27: case ST4:
28:    o1 = Reg_o1;
29:    CM_CHANGE_APPEND(4);
30:    STATE = ST1;
31:    break;
32: } end switch;
```

FIG. 8

| #StateNm | StateID | CondID | Source:line |
|---|---|---|---|
| ST1 | 1 | 0 | main.bdl:11 |
| ST2 | 2 | 1 | main.bdl:12,13 |
| ST2 | 2 | 2 | main.bdl:14,15 |
| ST3 | 3 | 3 | main.bdl:16 |
| ST4 | 4 | 4 | main.bdl:16 |

FIG . 9

```
1:  in ter(0:1) i1;
2:  in ter(0:1) i2;
3:  in ter(0:1) i3;
4:  out reg(0:1) o1;
5:
6:  process main(){
7:    var(0:1) A;
8:    var(0:1) B;
9:    var(0:1) C;
10:
11:   A=i2; B=i3;
12:   if ( i1 != 0 ) {
13:     C = A + 10;
14:   } else {
15:     C = B + 20;
16:   }
17:   o1 = A+B+C;
18: }
```

FIG. 10

```
1 : in ter(0:1) i1, i2, i3, i4;
2 : out reg(0:1) o1;
3 :
4 : process main(){
5 :   var(0:1) A;
6 :   var(0:1) B;
7 :   var(0:1) C;
8 :   var(0:1) D;
9 :
10:   A=i2; B=i3;
11:   if ( i1 != 0 ) {
12:       if ( i4 != 0 ){
13:           C = A + 10;}
14:       else {
15:           C = A + 5;}}
16:   else {
17:       C = B + 20;}
18:   D = A + 1;
19:   o1 = A+B+C+D;
20: }
```

FIG. 11

```
1 :#define CM_CHANGE_APPEND(pos)
{CysimChangeList[CysimChangeTableMax++]=pos;}
2 : in ter(0:1) i1, i2, i3, i4;
3 : out reg(0:1) o1;
4 :
5 : switch (STATE){
6 : case ST1:
7 :    Reg_A = i1; Reg_B = i3;
8:     CM_CHANGE_APPEND(0);
9 :    STATE = ST2;
10:    break;
11: case ST2:
12:    if ( i1 != 0){
13:       if ( i4 != 0 ){
14:          CM_CHANGE_APPED(1);
15:          Reg_C = Reg_A + 10;}
16:       else {
17:          CM_CHAGE_APPEND(2);
18:          Reg_C = Reg_A + 5;}}
19:    else {
20:       CM_CHANGE_APPEDN(3);
21:       Reg_C = Reg_B + 20;}
22:    Reg_D = Reg_A + 1;
23     CM_CHANGE_APPEDN(4);
24:    STATE = ST3;
25:    break;
26: case ST3:
27:    Reg_o1 = Reg_A + Reg_B + Reg_C + Reg_D;
28:    CM_CHANGE_APPEND(5);
29:    STATE = ST4;
30:    break;
31: case ST4:
32:    o1 = Reg_o1;
33:    CM_CHANGE_APPEND(6);
34:    STATE = ST1;
35:    break;
36: } end switch;
```

FIG . 12

| #StateNm | StateID | CondID | Source:line |
|---|---|---|---|
| ST1 | 1 | 0 | main2.bdl:10 |
| ST2 | 2 | 1 | main2.bdl:11-13 |
| ST2 | 2 | 2 | main2.bdl:14-15 |
| ST2 | 2 | 3 | main2.bdl:16-17 |
| ST2 | 2 | 4 | main2.bdl:18 |
| ST3 | 3 | 5 | main2.bdl:19 |
| ST4 | 4 | 6 | main2.bdl:19 |

FIG . 13

```
1 : in ter(0:1) i1, i2, i3, i4;
2 : out reg(0:1) o1;
3 :
4 : process main(){
5 :    var(0:1) A;
6 :    var(0:1) B;
7 :    var(0:1) C;
8 :    var(0:1) D;
9 :
10:    A=i2; B=i3;
11:    if ( i1 != 0 ){
12:       if ( i4 != 0 ){
13:          C = A + 10;}
14:       else {
15:          C = A + 5;}}
16:    else {
17:       C = B + 20;}
18:    D = A + 1;
19:    o1 = A+B+C+D;
20: }
```

FIG. 16

| BRANCH ID | NO. OF EXECUTIONS |
|---|---|
| 0 | 5 |
| 1 | 5 |
| 2 | 1 |
| 3 | 0 |
| 4 | 5 |
| 5 | 5 |
| 6 | 5 |

FIG . 17

```
1:  in ter(0:1) i1, i2, i3, i4;
2:  out reg(0:1) o1;
3:
4:  process main(){
5:    var(0:1) A;
6:    var(0:1) B;
7:    var(0:1) C;
8:    var(0:1) D;
9:
10:   A=i2; B=i3;
11:   if ( i1 != 0 ) {
12:     if ( i4 != 0 ){
13:       C = A + 10;}
14:     else {
15:       C = A + 5;}}
16:   else {
17:     C = B + 20;}
18:   D = A + 1;
19:   o1 = A+B+C+D;
20: }
```

| Lines | NO. OF EXECUTIONS |
|---|---|
| 14–15 | 1 |
| 18 | 5 |

FIG . 18

COMPARATIVE EXAMPLE

```
1 : in ter(0:1) i1;
2 : in ter(0:1) i2;
3 : in ter(0:1) i3;
4 : out reg(0:1) o1;
5 :
6 : process main(){
7 :    var(0:1) A;
8 :    var(0:1) B;
9 :    var(0:1) C;
10:
11:    A=i2; B=i3;
12:    if ( i1 != 0 ) {
13:       C = A + 10;
14:    } else {
15:       C = B + 20;
16:    }
17:    o1 = A+B+C;
18: }
```

US 7,523,030 B2

SIMULATION SYSTEM AND COMPUTER PROGRAM

FIELD OF THE INVENTION

The present invention relates to the simulation technology of a logic circuit, and more particularly to a system, and a computer program for creating a simulation model through behavioral synthesis of a behavior level description and to a system, and a computer program for executing simulation using a simulation model.

BACKGROUND OF THE INVENTION

A technology for generating a simulation method and performing simulation is proposed by the applicant of the present invention, wherein the simulation method comprises the steps of receiving a source file, composed of a behavior level description, for behavioral synthesis with the behavior level description (algorithm description) as the hardware description; creating a finite state machine/data path model description, a variable/register/state position correspondence table, and a behavior level description source line/state position correspondence table, as a simulation model; and performing clock-level simulation (for example, see Patent Document 1).

Patent Document 1 discloses a configuration in which, when a state transition occurs, the current state position is obtained, the source line corresponding to the state position is obtained from the line information table, and the source line is highlighted (or displayed in reverse video) on the GUI (Graphical User Interface) such as an execution display window as shown in FIG. 18 for letting the user identify the current execution position on the behavior level description. For how to create a finite state machine/data path model description and a behavior level description source line/state position correspondence table from a behavior level description, also see the description in Patent Document 2, proposed by the applicant of the present invention, that is given below.

[Patent Document 1]
Japanese Patent Kokai Publication No. JP-P2001-109788A (FIG. 9, FIG. 11)

[Patent Document 2]
Japanese Patent Kokai Publication No. JP-P2003-67438A (FIG. 2, FIG. 5)

As described in Patent Documents 1 and 2, a method for allowing the user to recognize the correspondence between the simulation execution states and the behavior level description source during the simulation of the hardware description including a behavior level description is efficient, for example, in a circuit design process.

According to the method described in Patent Document 1, the correspondence between the simulation execution states and the behavior level description source lines in the simulation model of a finite state machine structure is based on state transition units, for example, state 1 corresponds to the third line of source File1.c, state 2 is to the fourth line of source file File2.c, and state 3 is to the fourth line of source file File 3.c (see FIG. 9 in Patent Document 1).

A simulation model sometimes includes a conditional branch in a state entered by a transition (for example, see if statement in FIG. 18). And, it is known that, in a hardware description, there is a relatively high possibility that a bug lurks in a conditional branch.

In consideration of the fact described above, the inventor of the present invention has found that the correspondence between the simulation execution states and the behavior level description source lines should be based, not on a state transition, but on a conditional branch statement whose granularity is finer than that of the state transition, to provide the user with more detailed information to increase debugging accuracy and circuit design efficiency.

The inventor of the present invention has also found that the method described in above-described Patent Document 1 for managing the correspondence between the simulation execution states and the behavior level description source lines on a state transition basis can be improved to implement a function that establishes the correspondence between conditional branch statements included in a behavior level description and the simulation execution states.

SUMMARY OF THE DISCLOSURE

A simulation model generation device in accordance with one aspect of the present invention comprises:

a synthesis unit that receives a source file, including a behavior level description composed of a plurality of lines, for generating a simulation model, including a finite state machine structure, from the behavior level description; and a branch ID management/assignment unit that assigns identification information (hereinafter referred to as a "branch ID") to a conditional branch statement in a state in the simulation model.

Preferably, the simulation model generation device according to the present invention further comprises a table creation unit that generates a correspondence between the branch IDs and source line numbers in the behavior level description in a table format.

Preferably, in the simulation model generation device according to the present invention, the branch ID management/assignment unit may assign a branch ID to a branch destination when the condition of the conditional branch statement is satisfied and/or to a branch destination when the condition is not satisfied.

Preferably, the simulation model generation device according to the present invention, the branch ID management/assignment unit may assign one branch ID to a state in which the conditional branch statement is not included.

Preferably, in the simulation model generation device according to the present invention, the branch ID assigned to the simulation model is defined as a storage structure to which, each time a line having the branch ID inserted is executed during execution of the simulation model by said simulator, said branch ID is added.

A simulation device in accordance with another aspect of the present invention comprises:

a simulator that receives a simulation model for executing simulation wherein a branch ID is assigned to a conditional branch statement in a state included in the simulation model, the simulation model being generated through behavioral synthesis of a behavior model description composed of a plurality of lines, the simulation model including a finite state machine structure;

a storage unit in which a correspondence between the branch IDs and line numbers of a source of the behavior level description is stored; and a simulation monitor that monitors the execution of simulation, extracts the branch ID in a state when a state transition to said state occurs, obtains a source line number in the behavior level description corresponding to the extracted branch ID based on the correspondence between the branch IDs and source line numbers in the behavior level description stored in the storage unit, and, when the source of the behavior model description composed of the plurality of lines is output to an output device, outputs a source line in the behavior level description having the obtained line number in a form distinguishable from other lines.

This configuration allows the user to check if the condition is satisfied during the execution of simulation on a basis of a source line in the behavior level description.

The simulation device according to the present invention may further comprise a break branch ID storage unit in which a branch ID used as a breakpoint is stored, the breakpoint being a point at which the execution of simulation is to be stopped, wherein, during the execution of simulation, the control unit compares the extracted branch ID with the branch ID stored in the break branch ID storage unit to check if they match and, if they match, stops the execution of simulation.

The simulation device according to the present invention may further comprise a branch ID accumulation unit in which, each time the branch ID is extracted during the execution of simulation, a value indicating an accumulated number of executions of the extracted branch ID is stored for each branch ID, wherein the control unit obtains a source line number in the behavior level description corresponding to the extracted branch ID based on the correspondence between the branch IDs and source line numbers in the behavior level description stored in the storage unit, obtains the number of executions corresponding to the branch ID from the branch ID accumulation unit, and outputs the number of executions to the output device with the number of executions made to correspond to a source line in the behavior level description having the obtained line number.

A simulation system in accordance with another aspect of the present invention comprises:

a simulation model generation unit for generating a simulation model from a behavior level description of a logic circuit composed of plurality of source lines, at least one of said source lines including a conditional branch statement, said simulation model generation device assigning branch ID to the conditional branch statement in a state in the generated simulation model;

a simulator, receiving said simulation model generated by said simulation model generation unit, for executing said simulation model; and a simulation monitor for monitoring execution of said simulation model by said simulator to extract a branch ID in a state when a state transition to said state occurs and for picking out a source line of a behavior level description corresponding to the extracted branch ID.

Preferably, a simulation system according to the present invention comprises:

a first storage unit in which a source file of a behavior level description composed of a plurality of lines is stored;

a second storage unit in which a correspondence between branch IDs and source line numbers in the behavior level description is stored;

a simulation model generation unit comprising a synthesis unit that receives a source file of the behavior level description from the first storage unit for generating a simulation model including a finite state machine structure from the behavior level description; a branch ID management/assignment unit that assigns branch ID to a conditional branch statement in a state in the simulation model generated by the synthesis unit; and a table creation unit that generates a correspondence between the branch IDs and source line numbers in the behavior level description in a table format and stores the correspondence in the second storage unit;

a simulator that receives the simulation model, to which the branch IDs are assigned, for executing simulation; and a simulation monitor that monitors the execution of simulation, extracts the branch ID in a new state when a state transition to said new state occurs, obtains a source line number in the behavior level description corresponding to the extracted branch ID based on the correspondence between the branch IDs and source line numbers in the behavior level description stored in the second storage unit, and, when the source of the behavior model description composed of the plurality of lines is output to an output device, outputs a source line in the behavior level description having the obtained line number in a form distinguishable from other lines. In the present invention, the simulator executes simulation preferably on a cycle basis.

Preferably, in the simulation system according to the present invention, the branch ID assigned to the simulation model is defined as storage structure to which, each time a line having the branch ID inserted is executed during execution of the simulation model by said simulator, said branch ID is added.

Preferably, the simulation system according to the present invention, further comprises a break branch ID storage unit in which a branch ID used as a breakpoint is stored, said breakpoint being a point at which the execution of simulation is to be stopped, wherein, during the execution of simulation by said simulator, said simulation monitor compares the extracted branch ID with the branch ID stored in said break branch ID storage unit to check if they match and, if they match, stops simulation executed by said simulator.

Preferably, the simulation system according to the present invention, further comprises a branch ID accumulation unit in which, each time the branch ID is extracted during the execution of simulation, a value indicating an accumulated number of executions of the extracted branch ID is stored for each branch ID, wherein said simulation monitor obtains a source line number in the behavior level description corresponding to the extracted branch ID based on the correspondence between the branch IDs and source line numbers in the behavior level description, obtains the number of executions corresponding to the branch ID from said branch ID accumulation unit, and outputs the number of executions to said output device with the number of executions made to correspond to a source line in the behavior level description having the obtained line number.

A simulation model generation method in accordance with still another aspect of the present invention comprises the steps of:

(a1) receiving a behavior level description from a storage unit for generating a simulation model through behavioral synthesis, the storage unit storing therein a source file including the behavior level description composed of a plurality of lines, the simulation model including a finite state machine structure; and (a2) assigning a branch ID to a conditional branch statement in a state in the generated simulation model.

Preferably, the simulation model generation method according to the present invention further comprises the step of generating a correspondence between the branch IDs and source line numbers in the behavior level description in the source file in a table format.

A simulation method in still another aspect of the present invention comprises the steps of:

(b1) receiving a simulation model for executing simulation wherein a branch ID is assigned to a conditional branch statement in a state included in the simulation model, the simulation model being generated through behavioral synthesis of a behavior model description composed of a plurality of lines, the simulation model including a finite state machine structure;

(b2) monitoring the execution of simulation and, when a state transition to a new state occurs, extracting the branch ID in the new state;

(b3) obtaining a source line number in the behavior level description corresponding to the extracted branch ID by referencing a storage unit in which a correspondence between the branch IDs and line numbers of a source of the behavior level description is stored; and (b4) when the source of the behavior model description composed of the plurality of lines is output to an output device, outputting a source line in the behavior level description corresponding to the obtained line number in a form distinguishable from other lines.

Preferably, the simulation method according to the present invention further comprises the steps of:

presetting a branch ID used as a breakpoint in a storage unit, said breakpoint being a point at which the execution of simulation is to be stopped; and during the execution of simulation, comparing the extracted branch ID with the branch ID stored as the breakpoint to check if they match and, if they match, stopping the execution of simulation.

Preferably, the simulation method according to the present invention further comprises the steps of:

each time the branch ID is extracted during the execution of simulation, accumulating a number of executions of the extracted branch ID; and obtaining a source line number in the operation level description corresponding to the extracted branch ID based on the correspondence between the branch IDs and source line numbers in the operation level description stored in said storage unit, obtaining the number of executions corresponding to the branch ID, and displaying the number of executions with the number of executions made to correspond to a source line in the operation level description having the obtained line number.

A computer program in still another aspect of the present invention causes a computer, which has a storage unit storing therein a source file including a behavior level description composed of a plurality of lines, to execute the steps of:

(c1) receiving the source file from the storage unit for generating a simulation model from the behavior level description, the simulation model including a finite state machine structure; and (c2) assigning a branch ID to a conditional branch in a state in the generated simulation model.

A computer program in accordance with still another aspect of the present invention for use in a computer comprising:

a storage device comprising at least:
 a first storage unit that stores a simulation model wherein a branch ID is assigned to a conditional branch statement in a state included in the simulation model, the simulation model being generated through behavioral synthesis of a behavior model description composed of a plurality of lines, the simulation model including a finite state machine structure; and
 a second storage unit that stores a correspondence between the branch IDs in the simulation model and line numbers of a source of the behavior level description; and
an output device,
causes the computer to execute the steps of:

(d1) receiving the simulation model from the first storage unit for executing simulation;

(d2) monitoring the execution of simulation and, when a state transition to a new state occurs, extract the branch ID in the new state;

(d3) obtaining a source line number in the behavior level description corresponding to the extracted branch ID based on a correspondence between the branch IDs stored in the second storage unit and line numbers of a source of the behavior level description; and (d4) outputting a source line in the behavior level description corresponding to the obtained line number in a form distinguishable from other lines when the source of the behavior model description composed of the plurality of lines is output to the output device.

Preferably, in the program according to the present invention, said program further causes said computer to execute the steps of:

presetting a branch ID used as a breakpoint in a break branch ID storage unit, said breakpoint being a point at which the execution of simulation is to be stopped; and comparing the extracted branch ID with the branch ID stored in said break branch ID storage unit as the breakpoint during the execution of simulation to check if they match, and if they match, stopping the execution of simulation.

Preferably, in the program according to the present invention, said program further causes said computer to execute the steps of:

accumulating a number of executions of the branch ID for each branch ID each time the branch ID is extracted during the execution of simulation; and obtaining a source line number in the operation level description corresponding to the extracted branch ID based on the correspondence between the branch IDs and source line numbers in the operation level description, obtaining the number of executions corresponding to the branch ID, and outputting the number of executions to said output device with the number of executions made to correspond to a source line in the operation level description having the obtained line number The meritorious effects of the present invention are summarized as follows.

The present invention allows the user to understand the correspondence between a conditional branch statement in the behavior level description and the execution status of simulation to increase the debugging efficiency of a circuit design and to make the circuit design more efficient and easier.

The present invention allows the user to set a breakpoint on each branch ID or to understand the accumulated number of execution of a branch ID, further making the circuit design efficient and easier.

The present invention can be implemented by adding functions to existing simulation systems, computer program products, and so on to increase debugging accuracy while preventing an increase in, or even reducing, the development cost.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 4 is a diagram showing an example of a behavior level description (source file) in one embodiment of the present invention.

FIG. 7 is a diagram showing an example of a simulation model in one embodiment of the present invention.

FIG. 8 is a diagram showing an example of a behavior level description source line—branch ID correspondence table in one embodiment of the present invention.

FIG. 9 is a diagram showing an example of a source display in one embodiment of the present invention.

FIG. 10 is a diagram showing another example of a behavior level description source in one embodiment of the present invention.

FIG. 11 is a diagram showing another example of a simulation model in one embodiment of the present invention.

FIG. 12 is a diagram showing another example of the behavior level description source line—branch ID correspondence table in one embodiment of the present invention.

FIG. 13 is a diagram showing another example of a source display in one embodiment of the present invention.

FIG. 16 is a diagram showing an example of branch ID accumulation saving in the third embodiment of the present invention.

FIG. 17 is a diagram showing an example of a source display in the third embodiment of the present invention.

FIG. 18 is a diagram showing an example of a source display in Patent Document 1 shown as a comparative example.

PREFERRED EMBODIMENTS OF THE INVENTION

Figure 1:
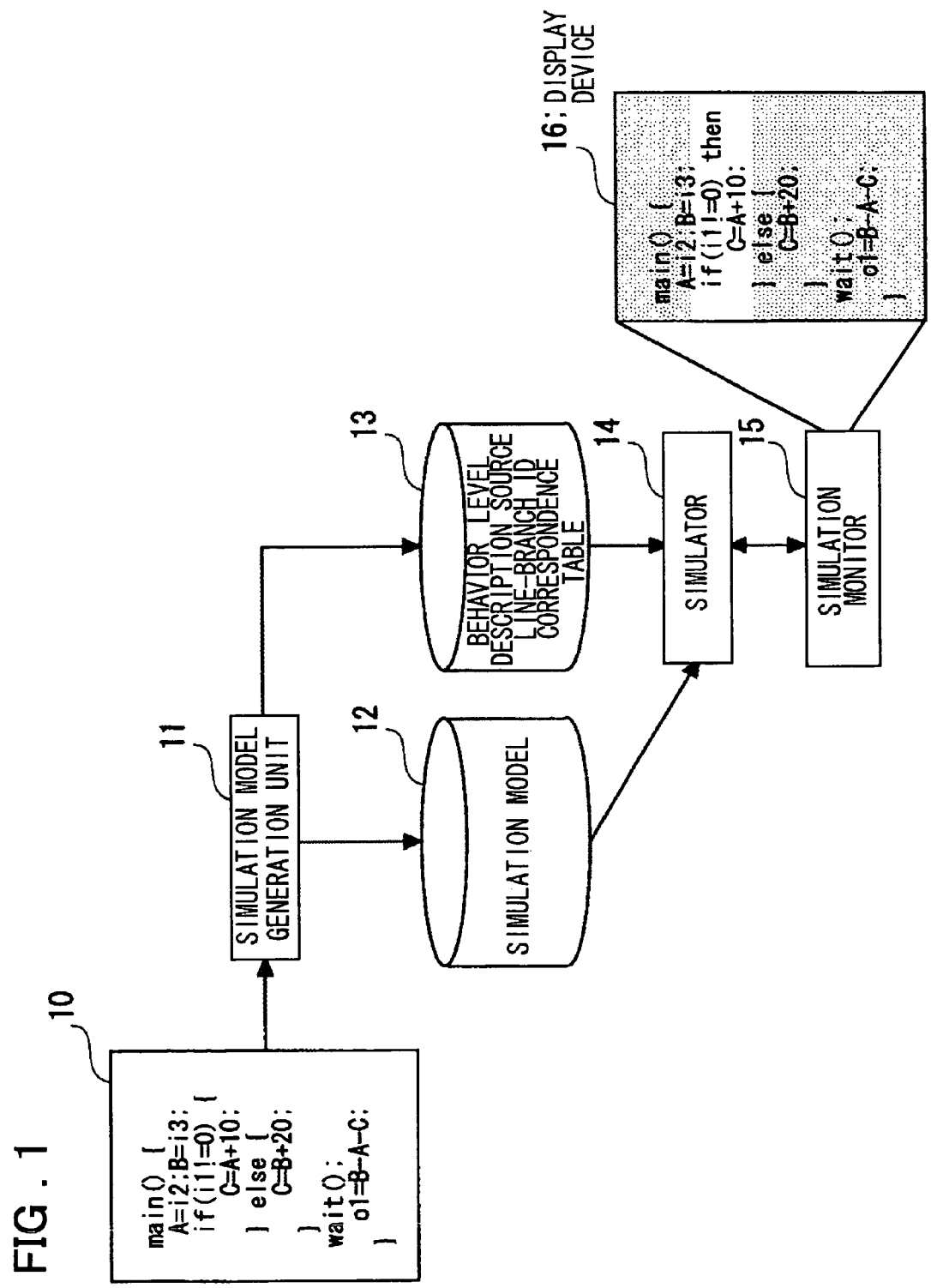
FIG. 1 is a diagram showing the system configuration of one embodiment of the present invention.

A preferred embodiment for practicing the present invention will be described. FIG. 1 is a diagram showing the general structure of a simulation system in one embodiment of the present invention. Referring to FIG. 1, a simulation system in the present embodiment comprises a simulation model generation unit 11 that receives a source file 10, which describes a hardware circuit using a behavior level description (an algorithm description) composed of multiple lines, for behavioral synthesis and generates a simulation model 12 including a finite state machine (FSM). The simulation model generation unit 11 assigns a branch ID to a conditional branch statement in the states included in the simulation model and generates a behavior level description source line—branch ID correspondence table 13, which is a correspondence table containing the correspondence between the assigned branch IDs and the behavior level description source lines. The simulation model 12 output by the simulation model generation unit 11 has branch IDs assigned to the state condition branch statements in the states.

The simulation system further comprises a simulator 14 that receives the simulation model 12 containing the conditional branch statements in the states to which branch IDs are assigned and that performs simulation preferably on a cycle basis. The simulation system further comprises a simulation monitor 15. The simulation monitor 15 monitors the execution of simulation executed by the simulator 14, extracts a new state entered by a state transition to the new state and the branch ID, and obtains the source line number of a behavior level description corresponding to the extracted branch ID from a behavior level description source line—branch ID correspondence table 13. When a behavior level description source line is displayed on a display device 16, the simulation monitor 15 highlights the behavior level description source line corresponding to the obtained line number to control the display output so that the line is distinguishable from other lines. Note that, in FIG. 1, the variable names and the register I/O correspondence table generated by the simulation model generation unit 11, which are not related directly to the subject of the present invention, are omitted. The present invention will be described more in detail with reference to the embodiments.

Figure 2:
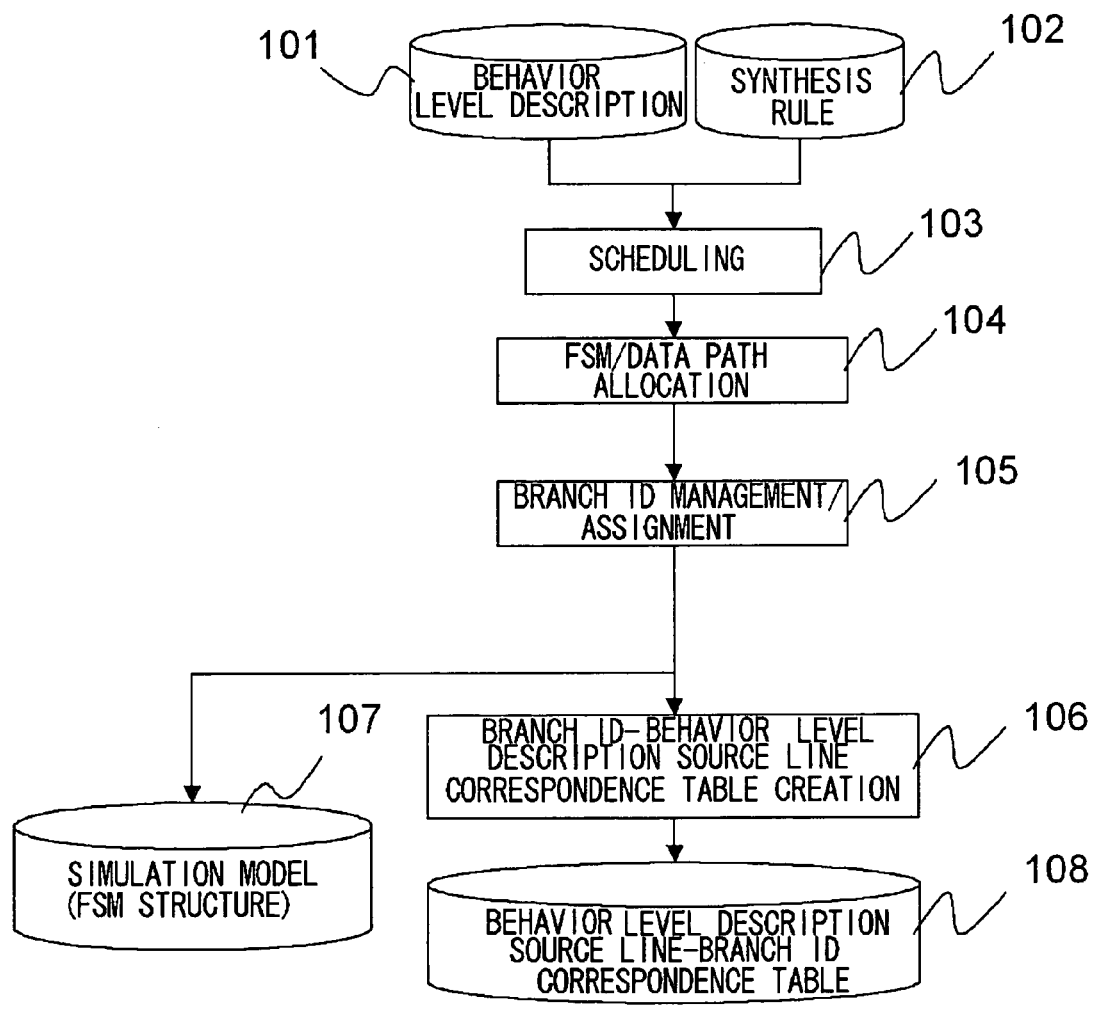
FIG. 2 is a diagram showing how to create a simulation model in one embodiment of the present invention.

FIG. 2 is a diagram showing the configuration of one embodiment of the present invention. The figure shows an example of the configuration and the operation of the simulation model generation unit (see the unit with numeral 11 in FIG. 1) that generates a simulation model from a behavior level description. Referring to FIG. 2, the simulation model generation unit in the present embodiment comprises a storage unit 101 in which the source file of a behavior level description is stored, a storage unit 102 in which synthesis constraints are stored, a scheduling unit 103, a finite state machine (FSM)/data path allocation unit 104, a branch ID management/assignment unit 105, a branch ID—behavior level description source line correspondence table creation unit 106, a storage unit 107 in which a generated simulation model is stored, and a storage unit 108 in which a branch ID—behavior level description source line correspondence table is stored. The storage units 101, 102, 107, and 108 may be provided in the same storage device or in separate storage devices. The scheduling unit 103 and the finite state machine (FSM)/data path allocation unit 104 compose a behavioral synthesis unit that automatically generates a simulation model. Note that the simulation model generation unit 11 in FIG. 1 may also have a configuration composed of the constant and variable optimization function (not shown), the scheduling function (numeral 103 in FIG. 2), the allocation function, the register sharing function, and the HDL (Hardware Description Language) generation function. Out of those functions, the register sharing function, which corresponds to the finite state machine (FSM)/data path allocation unit 104 in FIG. 2, executes the following functions: (1) creation of an FSM/data path model for controlling the repetition of state transition of multiple register resources, used under resource constraints, under control of the data path control (2) creation of variable/register/state position correspondence table containing the correspondence among variables, registers, and state positions and (3) creation of source line/state position correspondence table containing the correspondence between algorithm description source lines and the state positions (see FIG. 2 in Patent Document 2 described above).

FIG. 4 is a diagram showing an example of the source file of a behavior level description. The syntax of a behavior level description conforms to the C language specifications in the present embodiment. Needless to say, the behavior level description in the present invention is not limited to the C language. Referring to FIG. 4, the input terminals are defined in the first to third lines, and the output register is defined in the fourth line. The process 'main', coded in the sixth line to the 17th line, describes a circuit on the behavior level. In this process, the local variables A, B, and C are defined in the 7th to 9th lines. In the 11th line, the values of the input terminals i2 and i3 are set in the local variables A and B. The conditional branch statement in the 12th to 15th lines describes a condition in which, if the condition (i1!=0) of the if statement is satisfied (that is, i1 has a value other than 0), C=A+B is executed and, otherwise (i1 has the value of 0), the else statement C=B+20 is executed. In the 16th line, A+B+C is set in the register o1. Note that the example shown in FIG. 4 is for explanatory purposes only. It is apparent that the present invention is not limited to the behavior level description shown in FIG. 4.

The synthesis rule stored in the storage unit 102 contains resource constraint information. For example, only two computing units (adders) can be used at the same time under resource constraints.

The scheduling unit 103 reads the source file of the behavior level description (algorithm description) in FIG. 4, schedules the computing units, and performs time division of the computation processing so that the processing indicated by the behavior level description in FIG. 4 can be executed under the constraints that two adders can be used at the same time. For example, the scheduling unit 103 creates processing such as the one shown in FIG. 5 in which four clocks are used and the variables A, B, and C are used. State 1 to state 4 correspond to clock 1 to clock 4, respectively. In state 2 (ST2), the selector selects one of the addition result of the variable A and 10 generated by the adder (+) and the addition result of the variable B and 20 generated by the adder (+) based on the value of i1. In state 3 (ST3), the output of the selector is set in the variable C, and the addition result of the variables A and B and the value of the variable C are added up. In state 4 (ST4), the register o1 latches the addition result (A+B)+C.

Figure 5:
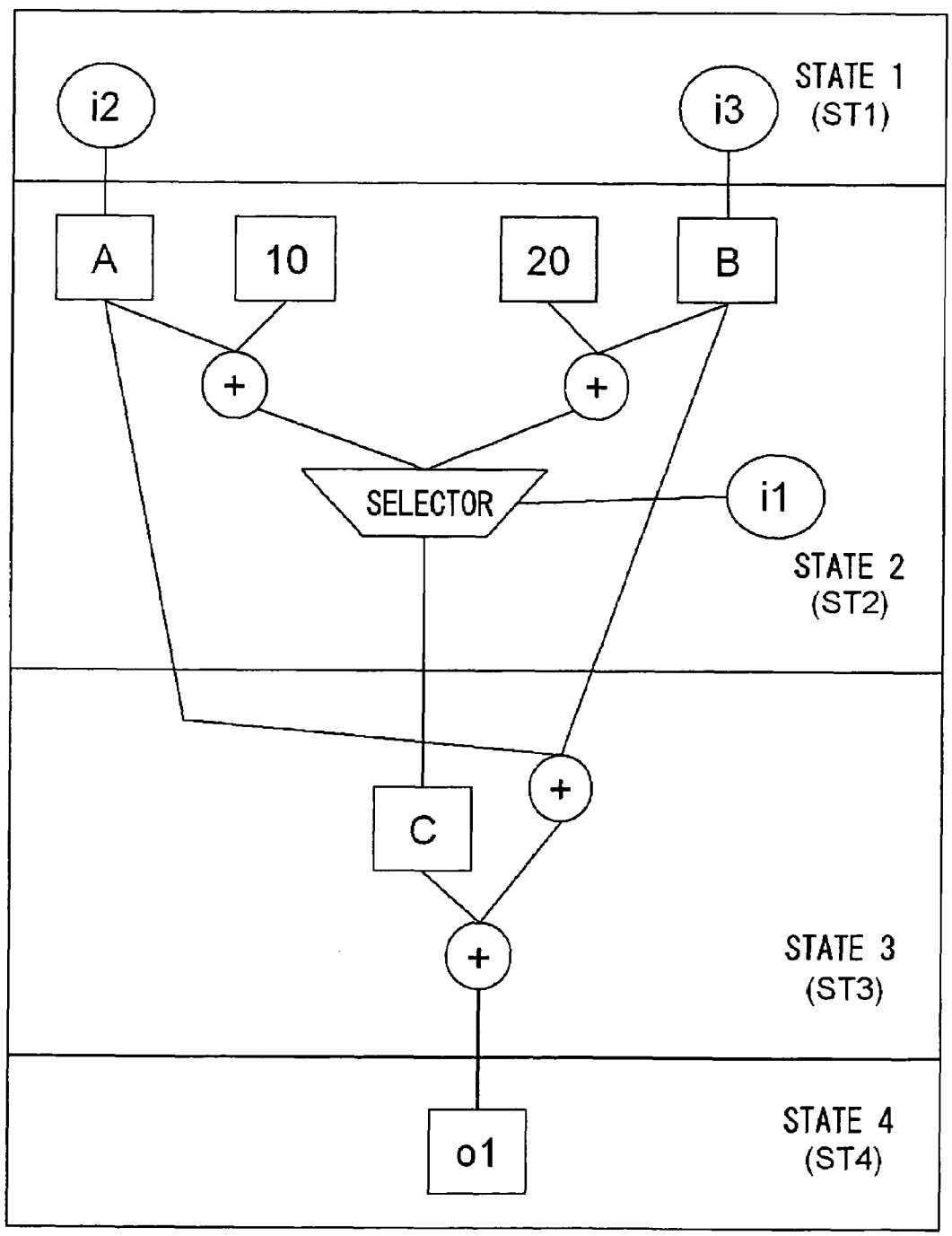
FIG. 5 is a diagram showing an example of scheduling generated from FIG. 4.
Figure 6:
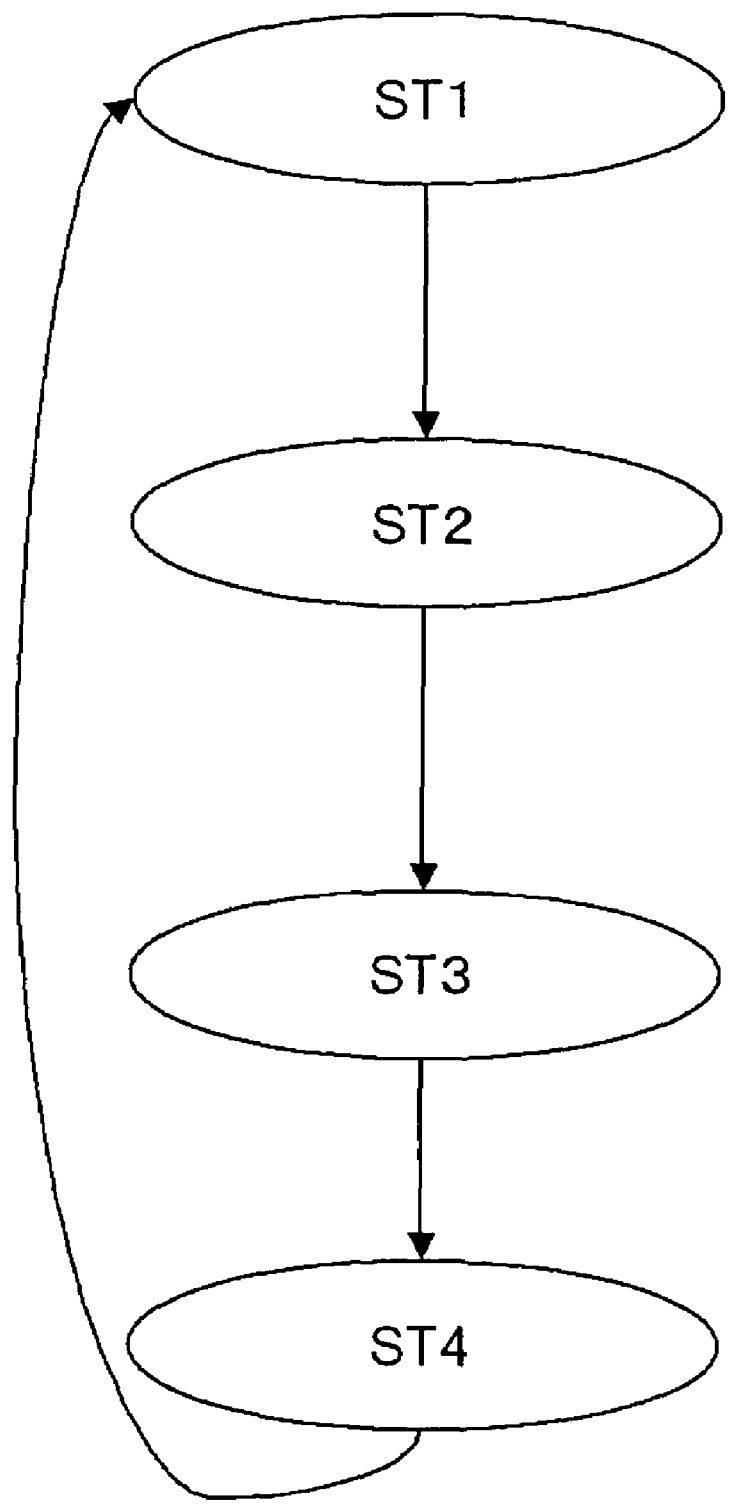
FIG. 6 is a diagram showing an example of state transition in FIG. 5.

FIG. 6 is a state transition diagram showing the transition among states from state 1 (ST1) to state 4 (ST4) in FIG. 5. A conditional branch is provided in state 2 (ST2) in FIG. 5. For details about how to generate the scheduling shown in FIG. 5 from the behavior level description shown in FIG. 4, see the description in Patent Document 2 given above.

FIG. 7 is a diagram showing an example of a simulation model into which, after an FSM data path is allocated (a model generated from the behavior level description in FIG. 4 through behavioral synthesis), the branch ID management/assignment unit 105 has inserted branch IDs.

In FIG. 7, the #define statement in the first line defines that CM_CHANGE_APPEND(pos) is made up of CysimChangeList[CysimChangeTableMax++]=pos. When the simulator (designated by a reference numeral 14 in FIG. 1) executes this simulator model and executes CM_CHANGE_APPEND(0) first, 0 is stored in element 0 (CysimChangeList[0]) of the list CysimChangeList as the branch ID and the index CysimChangeTableMax is incremented by 1. When CM_CHANGE_APPEND(0) is executed again, 0 is stored in the position of the current CysimChangeTableMax of the list CysimChangeList as the branch ID and CysimChangeTableMax is incremented by 1. Unless otherwise stated, CM_CHANGE_APPEND(pos) is defined in the present embodiment as the list structure CysimChangeList where the value pos of the branch ID to be executed is sequentially added to its end. Note that the configuration is not limited to a list structure or an array structure but that any other configuration that can store branch IDs may be used.

The states ST1 to ST4 in the simulation model are selectively executed according to the value of the variable STATE of the switch statement (SWITCH).

Although a conditional branch statement is not included in state ST1, 0 is assigned as the branch ID by CM_CHANGE_APPEND(0) inserted by the branch ID management/assignment unit (numeral 105 in FIG. 2). When STATE=ST2 included in state ST1 is executed, the state transition from state ST1 to state ST2 is performed. In this way, one branch ID is allocated to state ST1, in which no conditional branch is included, in the present embodiment.

In state ST2, the conditional branch statement "if then else" is executed. If the condition (i1!=0) in the if statement is satisfied, CM_CHANGE_APPEND(1) is inserted for the branch destination (Reg_C=Reg_A+10). If the condition (i1!=0) is not satisfied, CM_CHANGE_APPEND(2) is inserted for the branch destination (Reg_C=Reg_B+20). That is, branch IDs are allocated to "then" and "else" of the "if then else" statement, one for each. If the condition (i1!=0) of the if statement is satisfied, CM_CHANGE_APPEND(1) is executed; if the condition (i1!=0) is not satisfied, CM_CHANGE_APPEND(2) is executed. When STATE=ST3 is executed at the end of state ST2, the state transition to state ST3 is performed.

Although state ST3 does not include a conditional branch statement as in state ST1, CM_CHANGE_APPEND(3) is inserted by the branch ID management/assignment unit (numeral 105 in FIG. 2) and 3 is assigned as the branch ID. When STATE=ST4 is executed at the end of ST3, the state transition to state ST4 is performed.

Although state ST4 does not include a conditional branch statement either as in state ST1, CM_CHANGE_APPEND(4) is inserted by the branch ID management/assignment unit (numeral 105 in FIG. 2) and 4 is assigned as the branch ID. When STATE=ST1 is executed at the end of state ST4, the state transition to state ST1 is performed (see FIG. 6).

Each time CM_CHANGE_APPEND is executed in each state, the value of a branch ID passed by the argument pos is sequentially stored at the end of the list structure CysimChangeList (in the position indicated by the index CysimChangeTableMax). Therefore, if ten IDs, each having the value of 1, are stored while the index of CysimChangeList changes from 0 to CysimChangeTableMax, it means that the condition (i1!=0) of state 2 is satisfied 10 times. A serial number beginning with 0 is allocated to the branch ID for the simulation model in the present embodiment. Any identification information may be used as the branch ID, as long as branch IDs are uniquely identified. Needless to say, the branch ID, in the present invention is not limited to the serial number beginning with 0.

FIG. 8 is a diagram showing an example of the table, created by the branch ID—behavior level description source line correspondence table creation unit 106, containing the correspondence between the source lines of the behavior level description (see FIG. 4) and branch IDs. A list of correspondences between a state number (StateNm), a state ID (StateID), a conditional branch ID (CondID), and a source line (Source: line) is created in a table format.

Referring to FIG. 8, the conditional branch ID (CondID) of 0 is allocated to state ST1, and the source line corresponding to the conditional branch ID is the 11th line of main.bdl (see FIG. 4). For state ST2, the conditional branch ID of 1 is allocated and the source lines corresponding to the conditional branch ID are the 12th and 13th lines of main.bdl and the source lines corresponding to the conditional branch ID=2 are the 14th and 15th lines of main.bdl. The conditional branch ID of 3 is allocated to state ST3, and the source line corresponding to the conditional branch ID is the 16th line of main.bdl. The conditional branch ID of 4 is allocated to state ST4, and the source line corresponding to the conditional branch ID is the 16th line of main.bdl.

The processing of the simulation model generation unit (numeral 11 in FIG. 1) in the embodiment described above may also be implemented by a program executed on a computer.

The generation of a simulation model has been described. Next, the following describes a simulation method for executing simulation using a generated simulation model.

Figure 3:
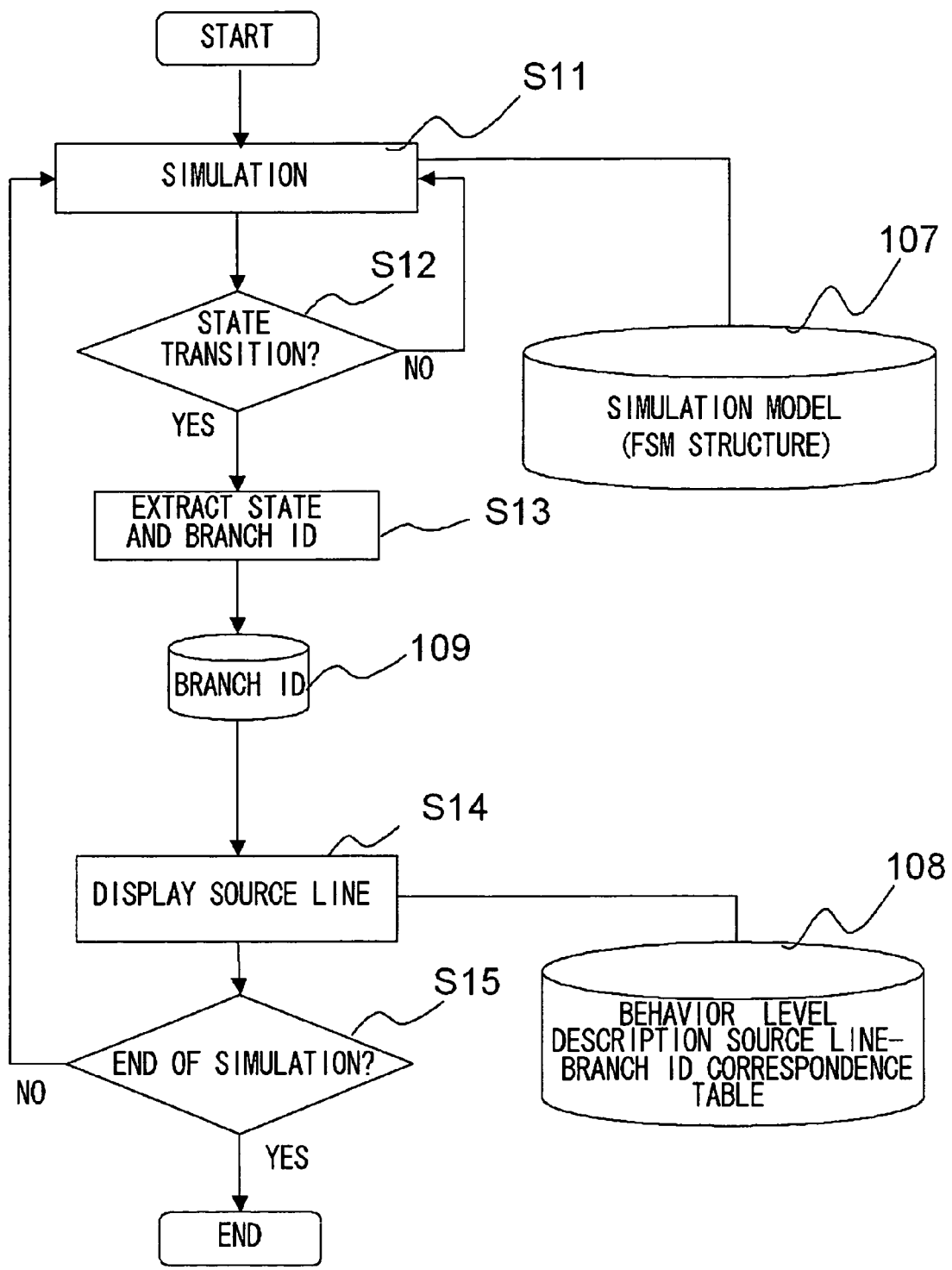
FIG. 3 is a flowchart showing a procedure for executing simulation in one embodiment of the present invention.

FIG. 3 is a flowchart showing the procedure of simulation in one embodiment of the present invention and shows the processing procedure executed by the simulator 14 and the simulation monitor 15 shown in FIG. 1.

With reference to FIG. 3, the simulation according to one embodiment of the present invention will be described. The cycle-based simulator (designated by a reference numeral 14 in FIG. 1) executes clock-based simulation (step S11). The simulation monitor (numeral 15 in FIG. 1) monitors the execution result of, and controls (start, stop, restart, etc.), the simulation.

If a state transition occurs as a result of the execution of the simulation model (YES in step S12), the simulation monitor (designated by a reference numeral 15 in FIG. 1) extracts the state and the branch ID and stores the extracted branch ID in a storage unit 109 (also referred to as a "branch ID storage unit") (step S13). The simulation monitor (designated by a reference numeral 15 in FIG. 1) monitors the value of the variable STATE of the simulation model shown in FIG. 7 and, upon detection of a change in the value of the variable STATE, recognizes that a state transition has occurred in step S12. In this case, the destination state of the state transition is indicated by the value newly set in the variable STATE. The extracted branch ID corresponds to the value of the argument pos of CM_CHANGE_APPEND(pos) executed in the state.

Next, the simulation monitor (designated by a reference numeral 15 in FIG. 1) searches the storage unit 108 (also referred to as an "behavior level description source line— branch ID correspondence table storage unit "), in which the behavior level description source line—branch ID correspondence table is stored, for the source line number corresponding to the branch ID stored in the storage unit 109. The simulation monitor 15 highlights (displays in reverse video) the source line corresponding to the branch ID on the screen of the display device (designated by a reference numeral 16 in FIG. 1) (step S14). The processing described above is repeated until the simulation ends (step S15).

For example, when the state transition from state ST1 to state ST2 is performed in FIG. 7 and CM_CHANGE_APPEND(1) is executed (branch ID=1), the simulation monitor 15 extracts state ST2 and the branch ID=1. The table shown in FIG. 8 indicates that the branch ID=1 corresponds to the 12th and 13th source lines of the behavior level description (see FIG. 4). Therefore, the simulation monitor 15 highlights the 12th and 13th lines as the corresponding behavior level description source lines on the screen (or in the window) of the display device (designated by a reference numeral 16 in FIG. 1) as shown in FIG. 9.

In the present embodiment, the displayed source lines corresponding to the extracted branch ID are only required to be distinguishable from other lines and, therefore, those source lines may be displayed not only in reverse video but also in a color different from that of other lines or with a predetermined symbol attached. In addition, when the source lines corresponding to the extracted branch ID are displayed in a format distinguishable from other lines, it is apparent that the output device is not limited to a display device but a printer or a file device may also be used.

The present embodiment described above, which is adapted to display the behavior level description corresponding to a conditional branch during simulation execution, is efficient in debugging and operation verification.

As an example to be compared with the present invention, FIG. 18 shows an example of a highlighted display generated by the system described in Patent Document 1. When, in the simulation, state transition of the simulation from state ST1 to state ST2 is performed, the source lines are highlighted on a state basis as shown in FIG. 18. Therefore, the result displayed on the screen does not provide information whether the condition (i1!=0) of the if statement is satisfied or the condition (i1!=0) is not satisfied and the else statement is executed.

FIG. 10 is a diagram showing another example of a behavior level description according to one embodiment of the present invention, where the conditional branches are nested. That is, if the condition of the if statement is satisfied (i1!=0), another check is made if the condition (i4!=0) of the nested if statement is satisfied. FIG. 11 is a diagram showing an example of a simulation model (branch IDs already inserted) generated by the simulation model generation unit (numeral 11 in FIG. 1) through behavioral synthesis of the behavior level description in FIG. 10. As in FIG. 7, a branch ID is defined by CM_CHANGE_APPEND(pos).

Referring to FIG. 11, CM_CHANGE_APPEND(1) is executed if the condition (i1!=0) of the if statement is satisfied and if the condition (i4!=0) is satisfied in state ST2 and the value of 1 is registered at the end of CysimChangeList as the branch ID. If the condition (i1!=0) is satisfied but if (i4!=0) is not satisfied, CM_CHANGE_APPEND(2) is executed and the value of 2 is registered at the end of CysimChangeList as the branch ID. If the condition (i1!=0) of the if statement is not satisfied, CM_CHANGE_APPEND(3) is executed and the value of 3 is registered at the end of CysimChangeList as the branch ID. When control leaves the conditional branch, CM_CHANGE_APPEND(4) is executed and the value of 4 is registered at the end of CysimChangeList as the branch ID. Although no conditional branch statement is specified for states ST1, ST3, and ST4, the value of 0, 5, or 6 is allocated as the branch ID respectively and, when the state transition to each state is performed, the value of the corresponding branch ID is registered at the end of CysimChangeList. FIG. 12 is a diagram showing the correspondence table indicating the correspondence between operation description source lines in FIG. 10 and branch IDs.

When the simulator (designated by a reference numeral 14 in FIG. 1) executes the simulation model in FIG. 11 and if the branch ID=2 and the branch ID=4 (that is, the 14th and 15th source lines of the behavior level description and the 18th line of the behavior level description) are satisfied when the state transition from ST1 to ST2 is performed, a plurality of source display lines are highlighted at the same time as shown in FIG. 13.

Figure 14:
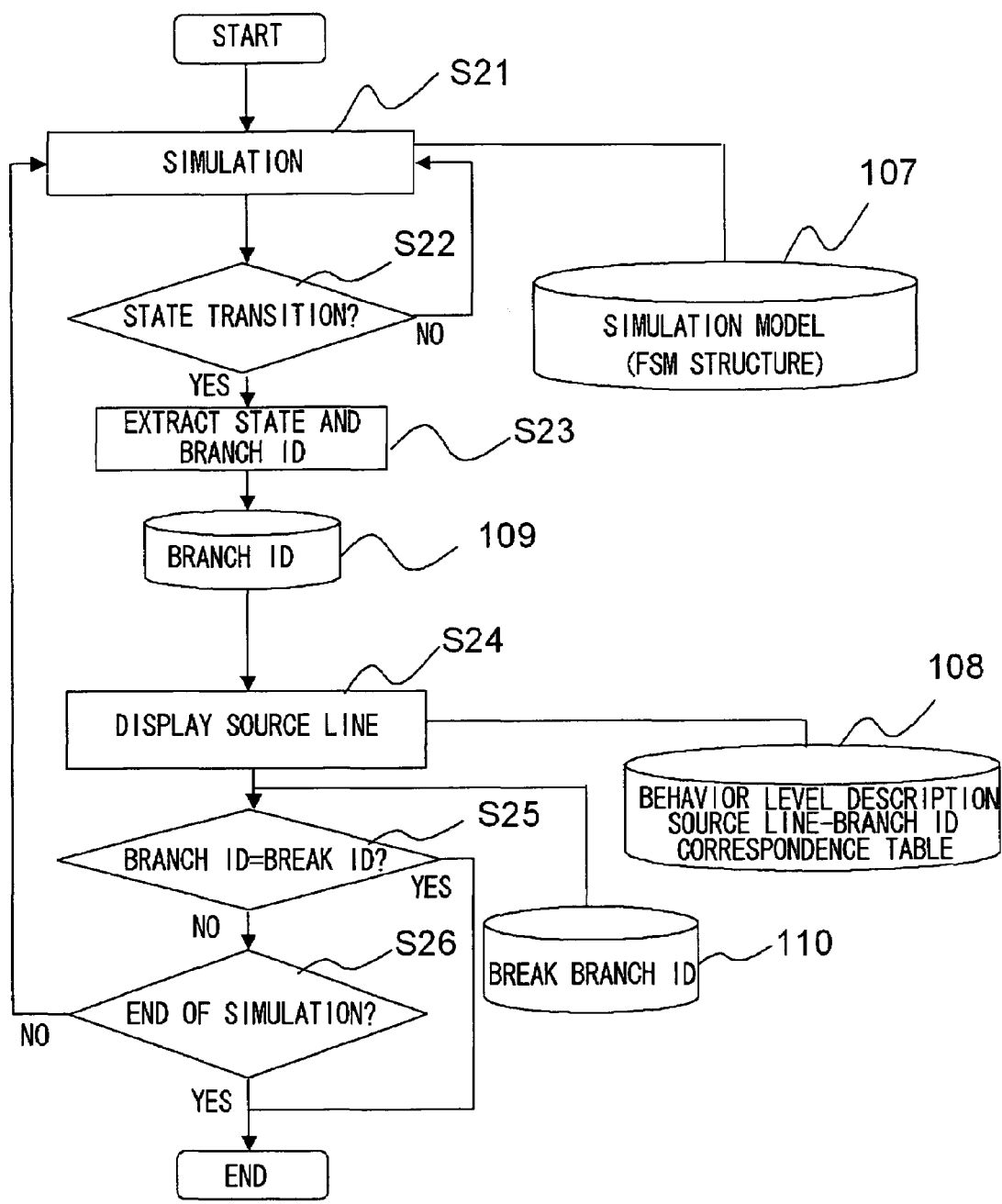
FIG. 14 is a flowchart showing a procedure for executing simulation in a second embodiment of the present invention.

Next, a second embodiment of the present invention will be described. FIG. 14 is a diagram showing the simulation procedure used in the second embodiment of the present invention. The basic configuration of the present embodiment is the same as that shown in FIG. 1. In the second embodiment of the present invention, a breakpoint can be set/reset for each branch ID.

Referring to FIG. 14, when simulation is executed (step S21) and a state transition occurs (YES in step S22), a simulation monitor (designated by a reference numeral 15 in FIG. 1) extracts the state and the branch ID, stores the branch ID in a storage unit 109, and highlights the source line(s) corresponding to the branch ID (step S24). The processing up to this step is the same as that in the embodiment described above.

In the present embodiment, a branch ID by which simulation is to be stopped is registered in a break branch ID storage unit 110 in advance via the GUI (Graphical User Interface). To reset a breakpoint set up for a branch ID, the branch ID need only to be deleted from the break branch ID storage unit 110 via the GUI interface.

After displaying the source line corresponding to the branch ID, the simulation monitor (designated by a reference numeral 15 in FIG. 1) compares the branch ID extracted in step S23 with the branch ID stored in the break branch ID storage unit 110 in advance (step S25). If they match, the simulation monitor 15 suspends (breaks) the simulation with the branch ID as the breakpoint. Then, the simulation monitor 15 analyzes (for example, dumps) the contents of the variables and registers as necessary. On the other hand, if the extracted branch ID does not match any break branch ID in step S25, the simulation monitor 15 continues the processing from step S21 unless the simulation is ended (NO in step S26). It is of course possible in the present embodiment to perform step execution between breakpoints (for example, for each branch ID).

Figure 15:
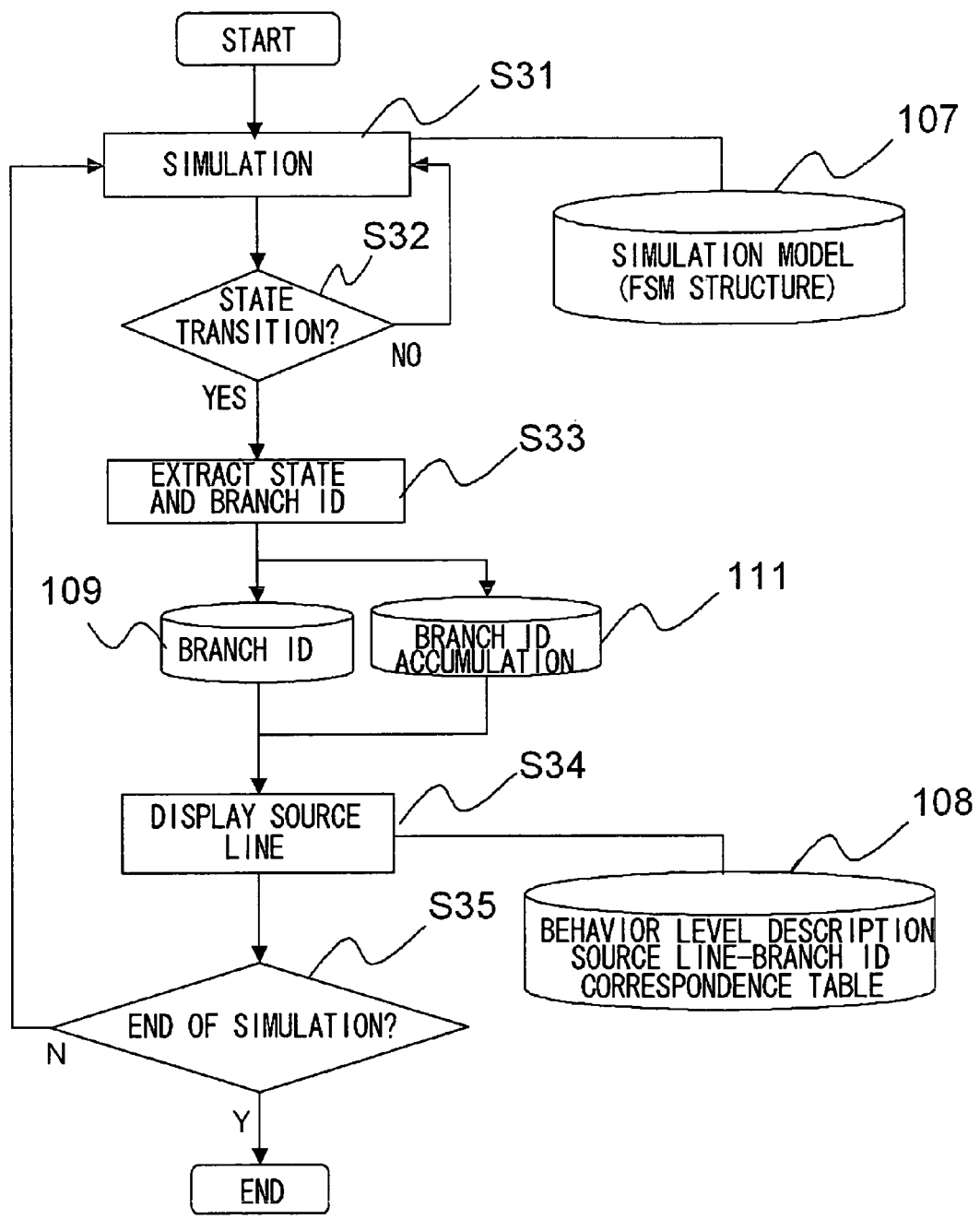
FIG. 15 is a flowchart showing a procedure for executing simulation in a third embodiment of the present invention.

Next, a third embodiment of the present invention will be described. FIG. 15 is a diagram showing the simulation processing procedure used in the third embodiment of the present invention. The basic system configuration of the present embodiment is the same as that shown in FIG. 1. In the third embodiment of the present invention, the number of executions of a specified conditional branch ID is accumulated to display how many times the simulation of the branch is executed during the simulation. A simulator (designated by a reference numeral 14 in FIG. 1) executes simulation for the simulation model (step S31), and a simulation monitor (designated by a reference numeral 15 in FIG. 1) monitors the execution of the simulation. When a state transition occurs (YES in step S32), the simulation monitor extracts the state and the branch ID (step S33), stores the branch ID in the storage unit 109, and highlights the source line (step S34). Up to this step, the processing is the same as that in the embodiments described above.

In the present embodiment, the number of branch IDs extracted in step S33 is incremented by one and is accumulated in a branch ID accumulation unit 111 that is a storage unit.

FIG. 16 is a diagram showing an example of the contents of the branch ID accumulation unit 111. The branch ID accumulation unit 111 stores the accumulated number of executions for each branch ID.

For example, when the simulation model shown in FIG. 11 is executed, the list CysimChangeList stores the branch ID values in elements from index 0 to CysimChangeTableMax. Therefore, the number of branch IDs stored in the list CysimChangeList can be accumulated for each of the branch ID values 0, 1, 2, 3, 4, 5, and 6 and output in a table format. This output gives the contents of the branch ID accumulation unit 111 such as the one shown in FIG. 16.

In the present embodiment, the accumulated number of executions of a branch ID is displayed beside the line number of the behavior level description source (highlighted) for the branch ID in step S34 in FIG. 15, for example, as shown in FIG. 17.

It is also possible that the accumulated number of executions of each branch ID is displayed, for example, at the completion of simulation, in the behavior level description source lines corresponding to all branch IDs in the simulation model. It is of course possible to combine the second embodiment and the third embodiment of the present invention. Note that the processing of the simulator 14 and the simulation monitor 15 described in the second and third embodiments may be implemented by programs executed on a computer.

Although the present invention has been described with reference to the embodiments described above, it is apparent that the present invention is not limited to the configuration of the embodiments but that the present invention includes changes and modifications that would be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A simulation system comprising:
    a simulation model generation unit for generating a simulation model from a behavior level description of a circuit composed of plurality of source lines, at least one of said source lines including a conditional branch statement, said simulation model generation device assigning identification information (hereinafter referred to as a "branch ID") to a conditional branch statement in a state in the generated simulation model;
    a simulator, receiving said simulation model generated by said simulation model generation unit and for executing said simulation model; and
    a simulation monitor for monitoring execution of said simulation model by said simulator to extract a branch ID in a state when a state transition to said state occurs and for picking out a source line of a behavior level description corresponding to the extracted branch ID.

2. The simulation system according to claim 1, wherein said simulation model generation unit comprises:
    a synthesis unit, receiving a source file, including the behavior level description composed of a plurality of lines, and generating said simulation model, including a finite state machine structure, from the behavior level description; and
    a branch ID management/assignment unit, assigning a branch ID to a conditional branch statement in a state in the simulation model.

3. The simulation system according to claim 2, wherein said simulation model generation unit comprises
    a table creation unit for generating a correspondence between the branch IDs and source line numbers in the behavior level description in a table format.

4. The simulation system according to claim 2, wherein said branch ID management/assignment unit assigns a branch ID to a branch destination when the condition of the conditional branch statement is satisfied and/or to a branch destination when the condition is not satisfied.

5. The simulation system according to claim 2, wherein said branch ID management/assignment unit assigns one branch ID to a state in which the conditional branch statement is not included.

6. The simulation system according to claim 2, wherein the branch ID assigned to the simulation model is arranged in a data storage structure to which, each time a line having the branch ID inserted is executed during execution of the simulation model by said simulator, said branch ID is added.

7. The simulation system according to claim 1, wherein said simulation model generation unit generates, through behavioral synthesis of the behavior model description composed of said plurality of lines, said simulation model including a finite state machine structure;

wherein said simulation system further includes a storage unit in which said simulation model generation unit stores a correspondence between the branch IDs and source line numbers of the behavior level description; and wherein said simulation monitor monitors the execution of simulation, extracts the branch ID in a state when a state transition to said state occurs, obtains a source line number in the behavior level description corresponding to the extracted branch ID based on the correspondence between the branch IDs and source line numbers in the behavior level description stored in said storage unit, and, when the source of the behavior model description composed of said plurality of lines is output to an output device, outputs a source line in the behavior level description having the obtained line number in a form distinguishable from other lines.

8. The simulation system according to claim 7, further comprising a break branch ID storage unit in which a branch ID used as a breakpoint is stored, said breakpoint being a point at which the execution of simulation is to be stopped;

wherein, during the execution of simulation, said simulation monitor compares the extracted branch ID with the branch ID stored in said break branch ID storage unit to check if they match and, if they match, stops the execution of simulation by said simulator.

9. The simulation system according to claim 7, further comprising a branch ID accumulation unit in which, each time the branch ID is extracted during the execution of simulation, a value indicating an accumulated number of executions of the extracted branch ID is stored for each branch ID; wherein said simulation monitor obtains a source line number in the behavior level description corresponding to the extracted branch ID based on the correspondence between the branch IDs and source line numbers in the behavior level description stored in said storage unit, obtains the number of executions corresponding to the branch ID from said branch ID accumulation unit, and outputs the number of executions to said output device with the number of executions made to correspond to a source line in the behavior level description having the obtained line number.

10. A simulation system comprising:

a first storage unit for storing a source file of a behavior level description of a circuit composed of a plurality of lines;

a second storage unit for storing a correspondence between branch IDs and source line numbers in the behavior level description;

a simulation model generation unit comprising:

a synthesis unit, receiving a source file of the behavior level description from said first storage unit, for generating a simulation model including a finite state machine structure from the behavior level description;

a branch ID management/assignment unit for assigning a branch ID to a conditional branch statement in a state in the simulation model generated by said synthesis unit; and a table creation unit for generating a correspondence between the branch IDs and source line numbers in the behavior level description in a table format to store the correspondence in said second storage unit;

a simulator, receiving the simulation model, to which the branch IDs are assigned, for executing simulation of said simulation model; and a simulation monitor for monitoring the execution of simulation, extracting the branch ID in a state when a state transition to said state occurs, obtaining a source line number in the behavior level description corresponding to the extracted branch ID based on the correspondence between the branch IDs and source line numbers in the behavior level description stored in said second storage unit, and, when the source of the behavior model description composed of said plurality of lines is output to an output device, outputting a source line in the behavior level description having the obtained line number in a form distinguishable from other lines.

11. The simulation system according to claim 10, wherein the branch ID assigned to the simulation model is arranged in a data storage structure to which, each time a line having the branch ID inserted is executed during execution of the simulation model by said simulator, said branch ID is added.

12. The simulation system according to claim 10, further comprising a break branch ID storage unit in which a branch ID used as a breakpoint is stored, said breakpoint being a point at which the execution of simulation is to be stopped; wherein, during the execution of simulation by said simulator, said simulation monitor compares the extracted branch ID with the branch ID stored in said break branch ID storage unit to check if they match and, if they match, stops simulation executed by said simulator.

13. The simulation system according to claim 10, further comprising a branch ID accumulation unit in which, each time the branch ID is extracted during the execution of simulation, a value indicating an accumulated number of executions of the extracted branch ID is stored for each branch ID, wherein said simulation monitor obtains a source line number in the behavior level description corresponding to the extracted branch ID based on the correspondence between the branch IDs and source line numbers in the behavior level description, obtains the number of executions corresponding to the branch ID from said branch ID accumulation unit, and outputs the number of executions to said output device with the number of executions made to correspond to a source line in the behavior level description having the obtained line number.

14. A program causing a computer, which has a storage unit storing therein a source file including a behavior level description of a circuit composed of a plurality of lines, to execute the steps of receiving a behavior level description from a storage unit for generating a simulation model through behavioral synthesis, said storage unit storing therein a source file including the behavior level description composed of a plurality of lines, said simulation model including a finite state machine structure;

assigning a branch ID to a conditional branch statement in a state in the generated simulation model;

generating a correspondence between the branch IDs and source line numbers in the behavior level description in a table format for storing into a storage unit;

monitoring the execution of simulation and extracting the branch ID in a state when a state transition to said state occurs;

obtaining a source line number in the behavior level description corresponding to the extracted branch ID by referencing a storage unit in which a correspondence between the branch IDs and line numbers of a source of the behavior level description is stored; and when the source of the behavior model description composed of said plurality of lines is output to an output device, outputting a source line in the behavior level description corresponding to the obtained line number in a form distinguishable from other lines.

15. The program according to claim 14, said program further causing said computer to execute the steps of:

presetting a branch ID used as a breakpoint in a break branch ID storage unit, said breakpoint being a point at which the execution of simulation is to be stopped; and comparing the extracted branch ID with the branch ID stored in said break branch ID storage unit as the breakpoint during the execution of simulation to check if they match and, if they match, stopping the execution of simulation.

16. The program according to claim 14, said program further causing said computer to execute the steps of:

accumulating a number of executions of the branch ID for each branch ID each time the branch ID is extracted during the execution of simulation; and obtaining a source line number in the behavior level description corresponding to the extracted branch ID based on the correspondence between the branch IDs and source line numbers in the behavior level description, obtaining the number of executions corresponding to the branch ID, and outputting the number of executions to said output device with the number of executions made to correspond to a source line in the behavior level description having the obtained line number.

* * * * *